(12) United States Patent
Olkanen et al.

(10) Patent No.: US 7,804,209 B2
(45) Date of Patent: Sep. 28, 2010

(54) ARRANGEMENT IN AN ELECTRICAL MACHINE

(75) Inventors: Kari Olkanen, Helsinki (FI); Jarkko Iisakkala, Julkujärvi (FI); Jari Jäppinen, Helsinki (FI)

(73) Assignee: ABB Oy, Helsinki (FI)

( * ) Notice: Subject to any disclaimer, the term of this patent is extended or adjusted under 35 U.S.C. 154(b) by 0 days.

(21) Appl. No.: 11/660,266

(22) PCT Filed: Jul. 29, 2005

(86) PCT No.: PCT/FI2005/000348

§ 371 (c)(1),
(2), (4) Date: Jul. 30, 2007

(87) PCT Pub. No.: WO2006/018473

PCT Pub. Date: Feb. 23, 2006

(65) Prior Publication Data

US 2007/0278870 A1 Dec. 6, 2007

(30) Foreign Application Priority Data

Aug. 19, 2004 (FI) ................................ 20041098

(51) Int. Cl.
*H02K 11/00* (2006.01)
*H02K 23/66* (2006.01)
(52) U.S. Cl. ............... 310/68 B; 310/68 A; 310/68 C; 310/68 D; 310/68 E; 310/68 R; 324/500; 324/537; 324/772
(58) Field of Classification Search ...... 310/68 A–68 E, 310/68 R; 324/500, 537, 772; *H02K 11/00, H02K 23/66*
See application file for complete search history.

(56) References Cited

U.S. PATENT DOCUMENTS

| 2,619,573 | A | * | 11/1952 | Dawson, Jr. ................. 338/26 |
| 1,492,022 | A | | 5/1957 | Kalikow et al. |
| 2,794,136 | A | | 5/1957 | Kalikow et al. |
| 3,909,673 | A | | 9/1975 | Kreissl et al. |
| 4,136,312 | A | * | 1/1979 | Salon et al. ................. 324/545 |
| 4,377,784 | A | * | 3/1983 | Saito et al. ................. 324/772 |
| 4,379,291 | A | | 4/1983 | Hubbard et al. |
| 4,539,499 | A | | 9/1985 | Punch et al. |
| 4,783,631 | A | * | 11/1988 | Nakashima et al. ......... 324/538 |
| 4,949,001 | A | * | 8/1990 | Campbell .................. 310/220 |
| 4,952,915 | A | * | 8/1990 | Jenkins et al. .............. 340/639 |

(Continued)

FOREIGN PATENT DOCUMENTS

DE 2 383 486 A1 6/1978

(Continued)

*Primary Examiner*—Quyen Leung
*Assistant Examiner*—John K Kim
(74) *Attorney, Agent, or Firm*—Buchanan Ingersoll & Rooney, P.C.

(57) ABSTRACT

The invention relates to an arrangement for indicating a fault in an electrical machine having a stator and a rotor with an air gap between it and the stator. In order to detect impurities or similar objects entering the air gap, a means of supervision is arranged on the stator surface facing the rotor. The means of supervision is at least partially protruding from the stator surface, and the integrity of the included detection element, such as a copper wire, is established using a supervision circuit connected to the detection element.

21 Claims, 2 Drawing Sheets

U.S. PATENT DOCUMENTS

| | | | |
|---|---|---|---|
| 5,213,212 A * | 5/1993 | Holzschuh | 206/397 |
| 5,232,285 A * | 8/1993 | Mannik | 374/131 |
| 5,827,198 A * | 10/1998 | Kassal | 600/528 |
| 6,028,382 A * | 2/2000 | Blalock et al. | 310/68 C |
| 6,066,905 A * | 5/2000 | Wright et al. | 310/179 |
| 6,078,119 A * | 6/2000 | Satoh et al. | 310/90.5 |
| 6,445,099 B1 | 9/2002 | Roseman | |
| 6,750,575 B2 * | 6/2004 | Wright | 310/68 B |
| 6,956,377 B2 * | 10/2005 | Masaoka | 324/522 |
| 2003/0156777 A1 * | 8/2003 | Bosselmann et al. | 385/12 |
| 2004/0227474 A1 * | 11/2004 | Tosiya | 318/135 |
| 2004/0245868 A1 * | 12/2004 | Wobben | 310/68 B |
| 2005/0264110 A1 * | 12/2005 | Humphries et al. | 310/68 B |

FOREIGN PATENT DOCUMENTS

| | | |
|---|---|---|
| EP | 1 158 086 A2 | 11/2001 |
| WO | WO 03001649 A1 * | 12/2003 |

\* cited by examiner

ARRANGEMENT IN AN ELECTRICAL MACHINE

RELATED APPLICATIONS

This application claims priority under 35 U.S.C. §119 Finish Application 20041098 filed in Finland on Aug. 19, 2004 and is a US national phase application of PCT/FI2005/000348 filed as an International Application on Jul. 29, 2005 designating the U.S., the entire contents of which are hereby incorporated by reference in their entireties.

TECHNICAL FIELD

An arrangement for indicating failure in an electrical machine is disclosed.

BACKGROUND INFORMATION

In an electrical machine the rotor rotates with an air gap between it and the stator. The rotor is most often fitted inside the stator, but solutions also exist in which the rotor is external to the stator or fitted with an air gap between it and the stator in the axial direction. The present invention is applicable to many different types of machines.

To the greatest extent possible, the air gap in the machine must be free of any dust and dirt coming from outside the machine and any impurities created in the machine during operation. Extra particles may affect the operating characteristics of the machine, such as noise and cooling, and may also cause direct or indirect damage to the machine's components. In particular, any impurities and particles of various sizes that have entered the air gap between the stator and rotor must be detected and removed before they cause damage to the stator or rotor.

The rotor of an electrical machine is supported on the stator body or end plate by bearings. These are also used to align the rotor with the centre of the stator so that the air gap is essentially equal in all positions. The rotor position may deviate from the centre line of the machine due to wear and tear on the bearings or potential bearing failure. In an extreme case this may lead to the rotor and stator coming into contact with each other.

SUMMARY

The purpose of the present invention is to create an arrangement that would detect and indicate any extraordinary situation, inappropriate object or particle in the air gap of an electrical machine well in advance so as to prevent damage to the electrical machine.

A solution according to the invention is able to reliably detect and react to any objects or particles found in the air gap of the machine that may damage the structure of the stator and/or rotor during operation. A means of supervision is arranged on the surface of the stator facing the rotor and protrudes from the stator surface towards the air gap, and a supervising circuit will react if a foreign object breaks the means of supervision. The supervision covers the entire length of the air gap in the axial direction of the machine.

According to a preferred embodiment, the breakage of a supervision conductor is monitored by means of an electric current, so that the number of conductor loops is even. This prevents a current from being induced into the supervision conductor due to variations of magnetic flux within the air gap.

According to a preferred embodiment of the invention, the means of supervision is attached to a stator tooth. The means of supervision is directly attached to the stator sheet pack and its connecting conductors can be located between the ends of the stator windings on the edge of the tooth.

According to another preferred embodiment of the invention, the means of supervision is attached to a wedge key in the stator groove. The means of supervision may also be integrated into a single entity with the wedge.

According to yet another preferred embodiment, the detection element within the means of supervision is a conductive wire coiled onto a core so that the wire is closest to the rotor in one or more positions in the longitudinal direction of the machine. According to another embodiment, the detection element within the means of supervision is a fibre optic conductor.

According to a preferred embodiment of the invention, the means of supervision is fitted at least onto the ends of the stator pack. Such a solution is particularly sufficient to indicate a bearing failure as the air gap will be reduced most at the ends of the machine.

An embodiment in which the means of supervision extends over the entire length of the stator is able to detect any foreign particle in the air gap.

According to a preferred embodiment of the invention, a supervision circuit will react to a break in the means of supervision and provide a fault indication signal. The supervision circuit can simultaneously disconnect the power supply to the machine or just provide an alarm signal.

According to a preferred embodiment, the means of supervision is connected in series with another supervision circuit. This eliminates the need to expand or modify the construction of the machine's supervision circuits.

BRIEF DESCRIPTION OF THE DRAWINGS

In the following the invention will be described in more detail with the help of certain embodiments by referring to the enclosed drawings, where.

DETAILED DESCRIPTION

Figure 1:
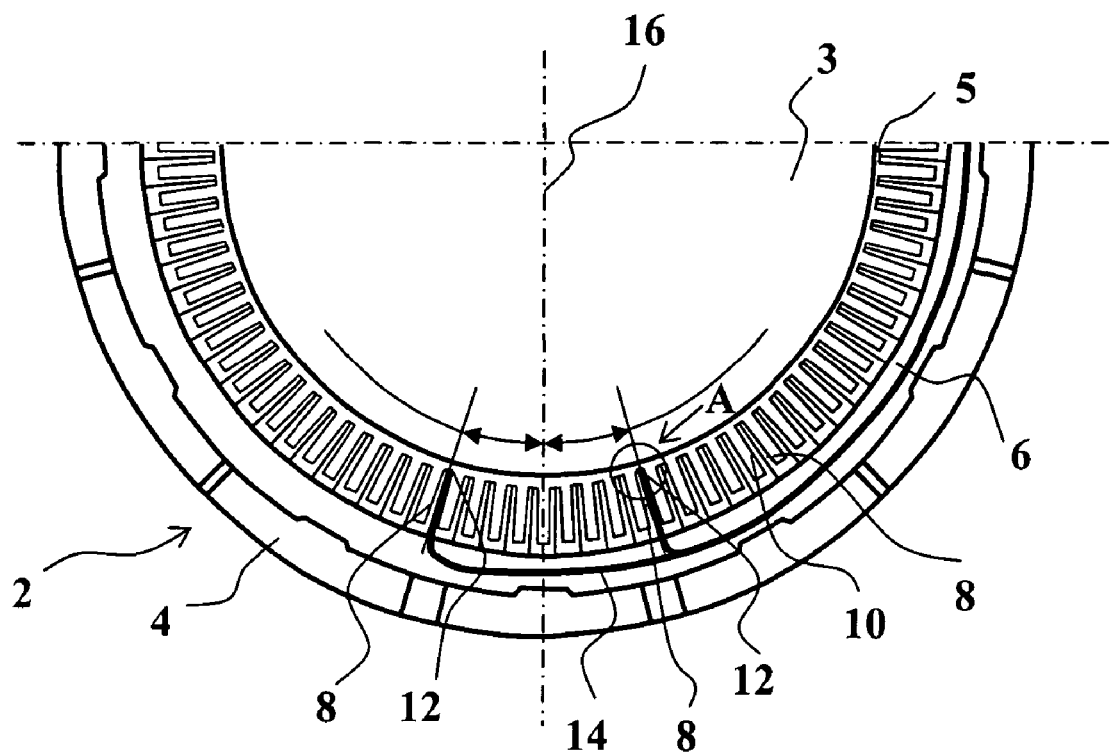
FIG. 1 illustrates the adaptation of a device according to the invention into an electrical machine.

FIG. 1 is a cross-section of the lower half of an electrical machine. The stator 2 is supported in a horizontal position, and the rotor 3 is installed with an air gap 5 between the stator and rotor. The stator sheet pack 6 is attached to the stator body 4. The stator sheet pack forms stator teeth 8 protruding towards the machine's air gap and stator grooves 10 between the teeth, opening towards the air gap. With regard to the implementation of the invention, the grooves can also be half-open or completely closed. The windings to be fitted into the grooves are not illustrated and can be implemented by generally known methods upon application of the invention.

When the machine is installed horizontally, a means of supervision 12 is fitted to the positions of the two teeth 8 in the lower section of the stator 2 and, preferably, extends over the entire length of the stator in the axial direction of the machine. The surface of the means of supervision 12 slightly protrudes from the surface of the stator teeth facing the air gap, and the included detection element is connected by a conductor 14 to a supervision circuit not included in the illustration, which is used to disconnect the machine from the power supply if necessary. The means of supervision 12 are preferably installed onto two teeth 8 located approximately 15 to 45 degrees to each side of the centre line 16 of the stator—that is, the lowest point. The exact location of the installation is determined on the basis of the machine's structure and manufacturing technology, for example the degree of support needed when inserting the rotor into the stator. A means of supervision mounted at the lower section of the stator will detect any objects detaching from and/or adhering to the rotor, as well as any other heavy particles and objects that have entered the machine.

Figure 2:
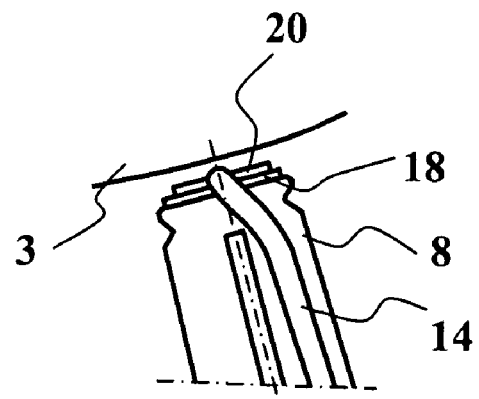
FIG. 2 illustrates a detail of a stator tooth end.

Enlargement A in FIG. 2 illustrates a detail of the attachment of the means of supervision 12. A strip of elastic material, such as felt, is glued onto the surface of the stator tooth 8 facing the air gap, and a sensor strip 20 is glued onto the elastic material using a suitable glue, such as Loctite® Hysol. Adhesion of the glue is ensured by suitably compressing the means of supervision over the entire length of the stator. The connecting conductor attached to the sensor strip 20 is to be protected and supported on the stator using known methods.

Figure 3:
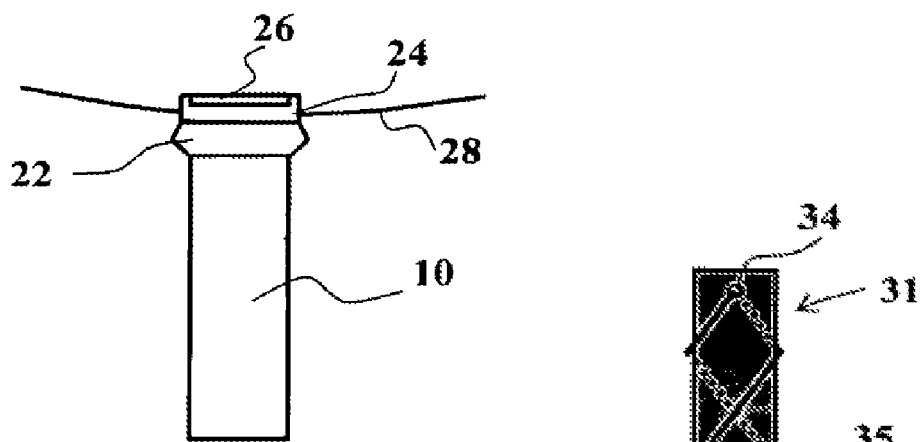
FIG. 3 illustrates an alternative position for the device.

The means of supervision 12 can alternatively be located in the stator groove 10. FIG. 3 illustrates such a solution in which the means of supervision means is attached to the wedge 22 closing the stator groove 10. As the wedge is slightly deeper than the stator teeth, the felt strip 24 must be sufficiently thick to make the sensor strip 26 for the means of supervision protrude enough from the inner surface 28 of the stator. The attachment of the means of supervision 12 and its connection to the supervision circuit is essentially similar to the embodiment of FIG. 2. Furthermore, the means of supervision means can be integrated with the wedge.

Instead of placement on both sides of the lowest point of the stator's inner circumference, the means of supervision can be equally distributed across the entire inner circumference of the stator or just placed at certain positions on the stator. There may also be only one means of supervision, in which case it is preferably located at the lowest point of the stator's inner circumference or in its immediate vicinity. However, it should be noted that as the breakage of a supervision conductor is monitored using an electric current, the number of conductor loops thus formed is preferably even, as this will prevent current from being induced into the supervision conductor due to variations in magnetic flux within the air gap.

Figure 4:
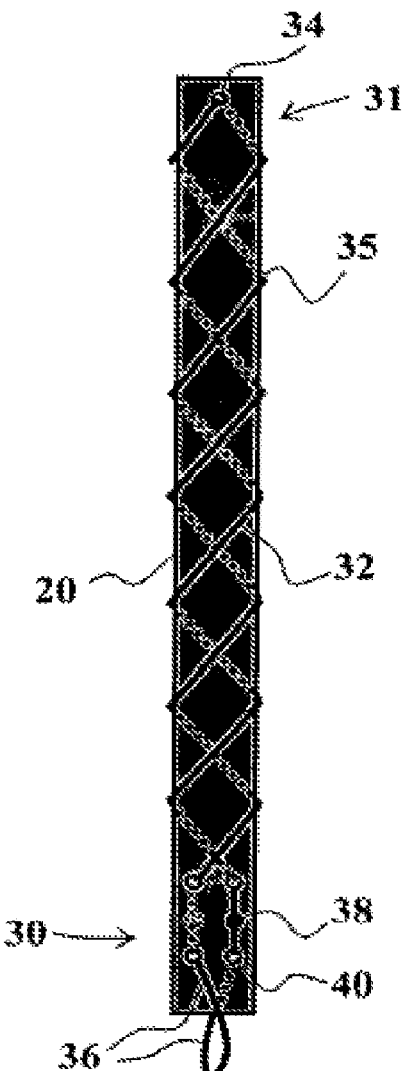
FIG. 4 illustrates a device according to the invention.
Figure 4:
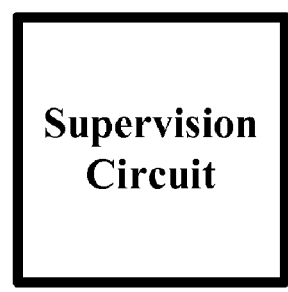

FIG. 4 illustrates a sensor strip structure according to the invention. The sensor strip 20 is formed of glass laminate that is approximately 0.5 mm thick and at least slightly narrower than the tooth. The first end 30 of the strip includes connection points for attaching the sensor to a connecting conductor going to the supervision circuit. A copper wire 32 sparsely coiled around the sensor strip acts as the detection element, extending from the connection end 30 of the strip to the other end 31 so that the side of the sensor strip facing the machine's air gap has copper wire across the entire length of the strip. In the example of FIG. 4, copper wires on the top and bottom sides jointly form a diamond pattern, which means that the top of the sensor strip has copper wire across the entire length of the strip. The edges of the sensor strip preferably have slots 35 at each location where the copper wire goes from one side of the strip to another. The other end 31 of the sensor strip has an opening 34 through which the copper wire goes. This also serves as attachment for the copper wire in the longitudinal direction. At the first end of the strip 30 the copper wire 32 is attached to the connecting conductor 36 at the connection point 38 fitted with a cable clamp 40. The connection point is protected with heat-shrink tubing and the connecting conductor is protected with material such as Teflon sheathing.

A stand-by current monitored by the supervision circuit is conducted into the copper wire 32 operating as the detection element. If a foreign object or particle enters the internals of the electrical machine, or if the machine is damaged so that a part becomes loose and ends up in the air gap between the stator and rotor, the copper wire coiled around the sensor strip will be broken by abrasion and the detection element's electric circuit will open. Correspondingly, should a bearing failure cause eccentricity in the rotor, the rotor will contact a means of supervision fitted on the inner surface of the stator. This will result in either a fault indication signal provided by the machine supervision equipment or automatic disconnection of the power supply to the machine. The supervision circuit may form its own electric circuit or it can be connected in series with another circuit that supervises the machine's condition, such as a stator winding temperature sensor.

As an alternative to electrically conductive wire, the detection element can be an optical fibre such as a fibre optic conductor. A light signal transmitted into the conductor is monitored by a component such as a photosensitive transistor that will provide a fault signal to the supervision circuit in the event of conductor breakage.

In the above, the invention has been described with the help of certain embodiments. However, the description should not be considered as limiting the scope of patent protection; the embodiments of the invention may vary within the scope of the following claims.

The invention claimed is:

1. An arrangement for indicating failure in an electrical machine, said arrangement comprising:
 a stator;
 a rotor with an air gap between said rotor and a surface of the stator facing the rotor;
 a means of supervision arranged on the stator surface facing the rotor, said means of supervision at least partially protruding from the stator surface, and including a detection element; and
 a supervision circuit connected to the detection element, said supervision circuit being configured to detect breakage of the detection element.

2. An arrangement according to claim 1, wherein the means of supervision is attached to a tooth of the stator.

3. An arrangement according to claim 1, wherein the means of supervision is attached to a wedge key in a groove of the stator.

4. An arrangement according to claim 1, wherein the means of supervision includes a core and the detection element within the means of supervision is a conductive wire coiled around the core so that the wire is closest to the rotor at one or more positions in the longitudinal direction of the machine.

5. An arrangement according to claim 1, wherein the detection element within the means of supervision is a fibre optic conductor.

6. An arrangement according to claim 5, wherein the means of supervision is fitted at least onto the ends of a stator sheet pack.

7. An arrangement according to claim 5, wherein the means of supervision extends over the entire length of the stator in the axial direction of the machine.

8. An arrangement according to claim 5, wherein the means of supervision is attached to the stator through an elastic bottom part.

9. An arrangement according to claim 5, wherein the detection element within the means of supervision is connected to a supervision circuit that, upon detecting a break in the detection element, will provide a fault indication signal and/or disconnect the power supply to the machine.

10. An arrangement according to claim 5, wherein the detection element is connected in series with another supervision circuit in the machine.

11. An arrangement according to claim 5, wherein the means of supervision is essentially fitted to the lowest point on the stator's circumference.

12. An arrangement according to claim 5, wherein the means of supervision are fitted at equal intervals on the stator's circumference.

13. An arrangement according to claim 4, wherein the means of supervision is an electrical conductor used to create an even number of conductor loops.

14. An arrangement according to claim 4, wherein the means of supervision is fitted at least onto the ends of the stator sheet pack.

15. An arrangement according to claim 4, wherein the means of supervision extends over the entire length of the stator in the axial direction of the machine.

16. An arrangement according to claim 4, wherein the means of supervision is attached to the stator through an elastic bottom part.

17. An arrangement according to claim 4, wherein the detection element within the means of supervision is connected to a supervision circuit that, upon detecting a break, will provide a fault indication signal and/or disconnect the power supply to the machine.

18. An arrangement according to claim 4, wherein the detection element is connected in series with another supervision circuit in the machine.

19. An arrangement according to claim 4, wherein the means of supervision is essentially fitted to the lowest point on the stator's circumference.

20. An arrangement for indicating failure in an electrical machine, the arrangement comprising:
   a stator;
   a rotor with an air gap between it and the stator;
   a circuit of supervision comprising a means of supervision arranged on a tooth of the stator or on a slot wedge of the stator,
   wherein:
      the means of supervision at least partially protrudes the from the stator surface toward the air gap,
      the means of supervision comprises a detection element made of a conductive wire or of a fiber optic conductor, and
      breakage of the detection element included in the means of supervision is established by a supervision circuit.

21. A system for indicating failure in an electrical machine having a stator and a rotor with an air gap between the rotor and a surface of the stator facing the rotor, said system comprising:
   a sensor device arranged on the stator surface facing the rotor, wherein:
      the sensor device partially protrudes from said stator surface, and
      the sensor device includes a core and a conductive wire disposed around the core such that the conductive wire is closer to the rotor than any portion of said surface of the stator; and
   a supervision circuit connected to the conductor element, said supervision circuit being configured to:
      detect breakage of the conductive wire and,
      upon detecting a break of the conductive wire, provide a fault indication signal and/or disconnect power supplied to the machine.

* * * * *